(12) United States Patent
Inomata

(10) Patent No.: US 8,450,800 B2
(45) Date of Patent: May 28, 2013

(54) SEMICONDUCTOR DEVICE

(75) Inventor: Hisao Inomata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/045,236

(22) Filed: Mar. 10, 2011

(65) Prior Publication Data

US 2011/0220992 A1 Sep. 15, 2011

(30) Foreign Application Priority Data

Mar. 15, 2010 (JP) ................................ 2010-057886
Dec. 16, 2010 (JP) ................................ 2010-280431

(51) Int. Cl.
*H01L 29/78* (2006.01)

(52) U.S. Cl.
USPC ........... 257/335; 257/336; 257/337; 257/338; 257/339; 257/329

(58) Field of Classification Search
USPC ................... 257/335–349, 330, E29.262, 329
See application file for complete search history.

(56) References Cited

U.S. PATENT DOCUMENTS

| 2001/0028083 A1 | 10/2001 | Onishi et al. |
| 2006/0151831 A1 | 7/2006 | Ninomiya et al. |
| 2007/0052015 A1 | 3/2007 | Miura et al. |
| 2009/0090968 A1 | 4/2009 | Ono et al. |
| 2010/0123186 A1* | 5/2010 | Ohta et al. .................... 257/329 |

FOREIGN PATENT DOCUMENTS

| JP | 2001-298190 | 10/2001 |
| JP | 2006-196518 | 7/2006 |
| JP | 2007-103902 | 4/2007 |
| JP | 2009-088345 | 4/2009 |

* cited by examiner

*Primary Examiner* — Lynne A. Gurley
*Assistant Examiner* — Tran Tran
(74) *Attorney, Agent, or Firm* — Foley & Lardner LLP

(57) ABSTRACT

In one aspect, a semiconductor device includes a semiconductor substrate; and a transistor element including a parallel structure of a first-conductivity-type drift region and a second-conductivity-type column region, and a second-conductivity-type base region, the transistor element being formed on the semiconductor substrate. An outer peripheral region located outside an element forming region has a parallel structure of a first-conductivity-type drift region and a second-conductivity-type column region, and a second-conductivity-type annular diffusion region which is formed at a side of the base region and which is spaced apart from the base region. An innermost end and a neighboring portion thereof of the annular diffusion region are located on the column region, and an outermost end of the annular diffusion region is located outside an outermost peripheral column region. A field insulating film that covers the annular diffusion region is stacked on the semiconductor layer in the outer peripheral region.

5 Claims, 11 Drawing Sheets

PRIOR ART

SEMICONDUCTOR DEVICE

CROSS-REFERENCE TO RELATED APPLICATIONS

This application is based upon and claims the benefit of priority from Japanese patent application No. 2010-57886, filed on Mar. 15, 2010, and Japanese patent application No. 2010-280431, filed on Dec. 16, 2010 the disclosures of which are incorporated herein in its entirety by reference.

BACKGROUND

The present invention relates to a semiconductor device having a so-called super junction structure.

As a typical semiconductor device which achieves a high breakdown voltage and a large current capacity, there is a power MOSFET (Metal-Oxide-Semiconductor Field-Effect Transistor). A power MOSFET of the type which allows a current to flow between a pair of electrodes formed on both surfaces of a substrate is called a vertical power MOSFET. Vertical power MOSFETs are widely used as switching devices and the like with a low on-resistance.

Vertical power MOSFETs are designed to have a predetermined breakdown voltage depending on the intended use. The term "predetermined breakdown voltage" herein used refers to a drain-source voltage obtained when a local electric field exceeds a critical value in some region of a device and a breakdown occurs. In general, there is a trade-off relationship between the breakdown voltage and the on-resistance. Accordingly, if a certain level of breakdown voltage is to be obtained, there is a limit to the reduction of the on-resistance.

In a vertical power MOSFET of related art, the breakdown voltage is determined by a p/n junction between a base region and a drift region (drain region with a low impurity concentration). In this regard, dependence of a theoretical minimum on-resistance on a breakdown voltage (referred to as "Si limit") has been known.

In recent years, as a technique for reducing the on-resistance in vertical power MOSFETs beyond the Si limit, a so-called super junction structure (SJ structure) has been proposed. Referring now to FIG. 7, a basic structure of a vertical power MOSFET having the SJ structure will be described. FIG. 7 is a cross-sectional view showing a main part of the vertical power MOSFET.

A MOSFET 500 shown in FIG. 7 includes:
a first-conductivity-type semiconductor substrate 501;
a semiconductor layer 601 which is formed on one surface (upper side of FIG. 7) of the semiconductor substrate 501;
an interlayer insulating film 610 which is formed on the semiconductor layer 601;
a source electrode 611 which is electrically connected to the semiconductor layer 601 through a contact hole formed in the interlayer insulating film 610;
a gate insulating film 606 and a gate electrode 607 which are formed within a trench formed from the upper surface of the semiconductor layer 601; and
a drain electrode 612 which is formed on the other surface (lower side of FIG. 7) of the semiconductor substrate 601.

The semiconductor layer 601 includes:
a first-conductivity-type drift region 602;
a second-conductivity-type base region 603 which is formed on the drift region 602;
a first-conductivity-type source region 604 which is formed at an upper layer portion of the base region 603; and
a second-conductivity-type column region 605 which is formed in a columnar shape within the drift region 602.

In this example, the semiconductor substrate 501 is n+ type; the drift region 602 is n type; the base region 603 is p type; the source region 604 is n+ type; and the column region 605 is p type.

Within the semiconductor layer 601, a parallel structure (p/n junction structure) is formed in which the first-conductivity-type drift region 602 and the second-conductivity-type column region 605 are formed in parallel in the substrate surface direction.

In the SJ structure, the amount of donor impurity in the drift region and the amount of acceptor impurity in the column region are set to be substantially equal to each other. As a result, the charge in the drift region is balanced with the charge in the column region (charge-balanced condition), thereby maximizing the breakdown voltage. Under the charge-balanced condition, when a reverse bias voltage is applied between the drain and source electrodes in the OFF state of the device, a depletion layer extends uniformly in the lateral direction from the p/n junction between the drift region and the column region. This facilitates connection between adjacent depletion layers. When the entire SJ structure is depleted and becomes a single depletion layer, equipotential surfaces are formed at substantially equal intervals and in substantially parallel to each other, thereby maximizing the breakdown voltage. At the stage of designing the SJ structure, the impurity concentration of the drift region can be increased under the charge-balanced condition (in the state where the breakdown voltage is maximized). This leads to a reduction in drift resistance and a reduction in on-resistance.

Further, in the case of designing a semiconductor chip of a power MOSFET, it is important to achieve a high breakdown voltage so as to prevent breakdown of the device due to concentration of an avalanche current in an outer peripheral region of the chip, even when an excessive inductive load is applied to the device. To achieve this, it is necessary to set the breakdown voltage of the outer peripheral region to be higher than the breakdown voltage of an element forming region (cell region) in which at least one MOSFET is formed.

As means for increasing the breakdown voltage of the outer peripheral region, there is proposed a structure in which a repeated structure of a columnar p/n junction, which is one of the characteristics of the SJ structure, is extended to the outer peripheral region.

Japanese Unexamined Patent Application Publication No. 2001-298190 and US Patent Application Publication No. 2001/0028083 which is based on Japanese Unexamined Patent Application Publication No. 2001-298190 disclose a structure in which a repeated structure of a columnar p/n junction similar to that of the element forming region is formed in the outer peripheral region, and the impurity concentration of the outer peripheral region is set to be equal to or lower than that of the element forming region. This structure facilitates depletion of the outer peripheral region at the level equal to or higher than that of the element forming region, thereby improving the breakdown voltage.

FIG. 19 of Japanese Unexamined Patent Application Publication No. 2001-298190 and FIGS. 17 and 18 of US Patent Application Publication No. 2001/0028083 disclose a structure in which the same repeated structure of a columnar p/n junction (specifically, a repeated structure of an n-type drift region (20a) and a p-type column region (20b)) is formed in each of an element forming region (122) and an outer peripheral region (20). On the element forming region (122) side of the outer peripheral region (20), annular shallow p-type regions (20c) having an impurity concentration higher than that of the column region (20b) are formed so as to surround the element forming region (122). A field insulating film (23)

for surface protection and stabilization is stacked on the semiconductor layer in the outer peripheral region (20). The column region (20b) is also formed in a region outside the annular shallow p-type regions (20c). In this region, the upper end of each column region (20h) is in contact with the field insulating film (23). No field electrode is provided on the field insulating film (23).

Japanese Unexamined Patent Application Publication No. 2007-103902 and US Patent Application Publication No. 2007/0052015 which is based on Japanese Unexamined Patent Application Publication No. 2007-103902 disclose a structure in which electric field concentration in an outer peripheral region is alleviated by defining a positional relationship between a p/n junction in the outer peripheral region and an inner end of a field insulating film.

FIG. 1 of Japanese Unexamined Patent Application Publication No. 2007-103902 and FIGS. 1A and 1B of US Patent Application Publication No. 2007/0052015 disclose a structure in which an outer peripheral region (56) has no annular shallow p-type region, and column regions (38) are formed at positions shallower than column regions (34, 36) in an element forming region (54). In the outer peripheral region (56), a field insulating film (46) and a field electrode (48) are stacked immediately above the column regions (38). The column regions (38) are formed under the field insulating film (46) in the outer peripheral region (56). Meanwhile, the column region (38) is not formed immediately below an inner end (64) of the field insulating film (46) and in its neighboring region, thereby alleviating the electric field concentration in the vicinity of the inner end (64) of the field insulating film (46).

FIG. 1 of Japanese Unexamined Patent Application Publication No. 2006-196518 and FIG. 1 of US Patent Application Publication No. 2006/0151831 which is based on Japanese Unexamined Patent Application Publication No. 2006-196518 disclose the following structure. That is, a shallow p-type region (105) and column regions (106) are formed in an outer peripheral region; a field insulating film (118) is formed in a region (a region in which the shallow p-type region (105) and the column regions (106) are not formed) outside an outermost peripheral column region (106a) in the outer peripheral region; and a field electrode (120) is formed in a region excluding portions immediately above the column regions (106) in the outer peripheral region.

In this regard, it is disclosed that the column regions (106a) are formed in the outer peripheral region, thereby maintaining a high breakdown voltage in the outer peripheral region. As disclosed in Japanese Unexamined Patent Application Publication No. 2006-196518 and US Patent Application Publication No. 2006/0151831, the field electrode (120) is not formed immediately above the column region (106a), thereby making it possible to form the column region (106a) after formation of the field electrode.

Japanese Unexamined Patent Application Publication No. 2009-088345 and US Patent Application Publication No. 2009/0090968 which is based on Japanese Unexamined Patent Application Publication No. 2009-088345 are cited for reference as a structure of the type in which the outer peripheral region has no columnar region. FIG. 1 of Japanese Unexamined Patent Application Publication No. 2009-088345 and FIG. 1 of US Patent Application Publication No. 2009/0090968 disclose the following structure. That is, p-type buried semiconductor regions (BGR1 to BGR4) are formed in the outer peripheral region instead of column regions (4); annular shallow p-type regions (GR1 to GR4) are formed above the buried semiconductor regions (BGR1 to BGR4); and a field electrode (14) is formed immediately above the annular shallow p-type regions (GR1 to GR4). Japanese Unexamined Patent Application Publication No. 2009-088345 discloses in paragraphs 0032 to 0041 that the annular shallow p-type regions (GR1 to GR4) and the buried semiconductor regions (BGR1 to BGR4) allow to suppress local electric field concentration.

SUMMARY

As a result of a detailed analysis, the present inventor has found that the breakdown voltage and breakdown resistance are not always sufficient in the outer peripheral region of the related art structures, as described later.

A first aspect of the present invention is a semiconductor device including:

a semiconductor substrate including a semiconductor layer formed on one surface thereof; and at least one transistor element including, in the semiconductor layer, a parallel structure in which a first-conductivity-type drift region and a second-conductivity-type column region are formed in parallel to each other in a substrate surface direction, and a second-conductivity-type base region formed above the parallel structure, the at least one transistor element being formed on the semiconductor substrate, in which in an outer peripheral region located outside an element forming region in which the at least one transistor element is formed, a parallel structure of a first-conductivity-type drift region and a second-conductivity-type column region, the parallel structure being the same as the parallel structure of the transistor element. and a second-conductivity-type annular diffusion region which is spaced apart from the base region at a side of the base region of the transistor element and which is formed in an annular shape in a plan view are formed in the semiconductor layer, an innermost end and a neighboring portion thereof of the second-conductivity-type annular diffusion region in the outer peripheral region are located on the column region, and an outermost end of the second-conductivity-type annular diffusion region in the outer peripheral region is located outside an outermost peripheral column region, and a field insulating film that covers the second-conductivity-type annular diffusion region is stacked on the semiconductor layer in the outer peripheral region.

According to an exemplary aspect of the present invention, as FIG. 3A illustrates a simulation example of equipotential surfaces, it is possible to provide a semiconductor device having a so-called super junction structure in which the electric field concentration is alleviated and the breakdown voltage and breakdown resistance are improved.

According to an exemplary aspect of the present invention, it is possible to provide a semiconductor device having a so-called super junction structure in which the electric field concentration is alleviated and the breakdown voltage and breakdown resistance are improved.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
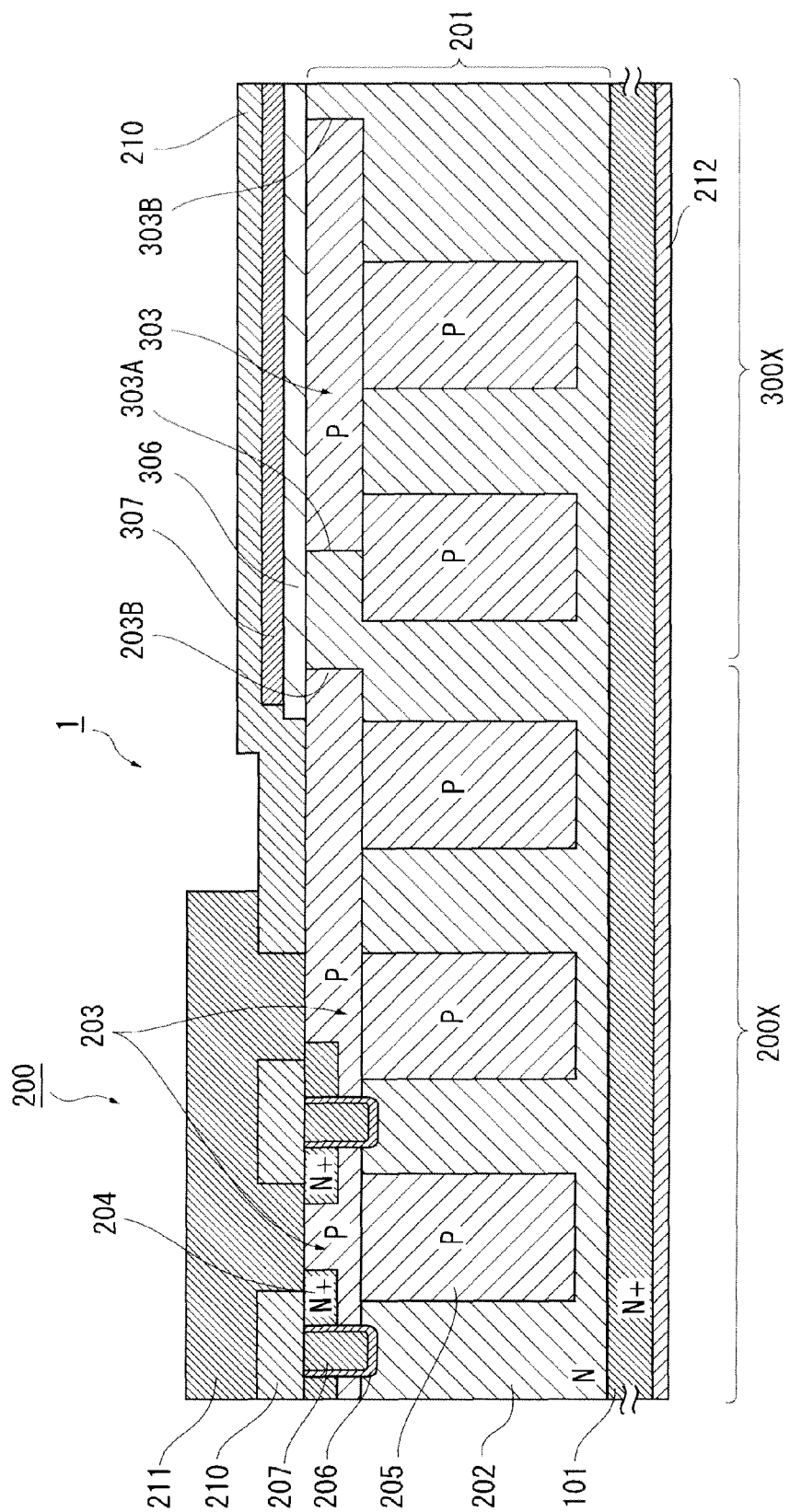
FIG. 1 is a cross-sectional view showing a main part of a semiconductor device according to a first embodiment of the present invention.
Figure 2A:
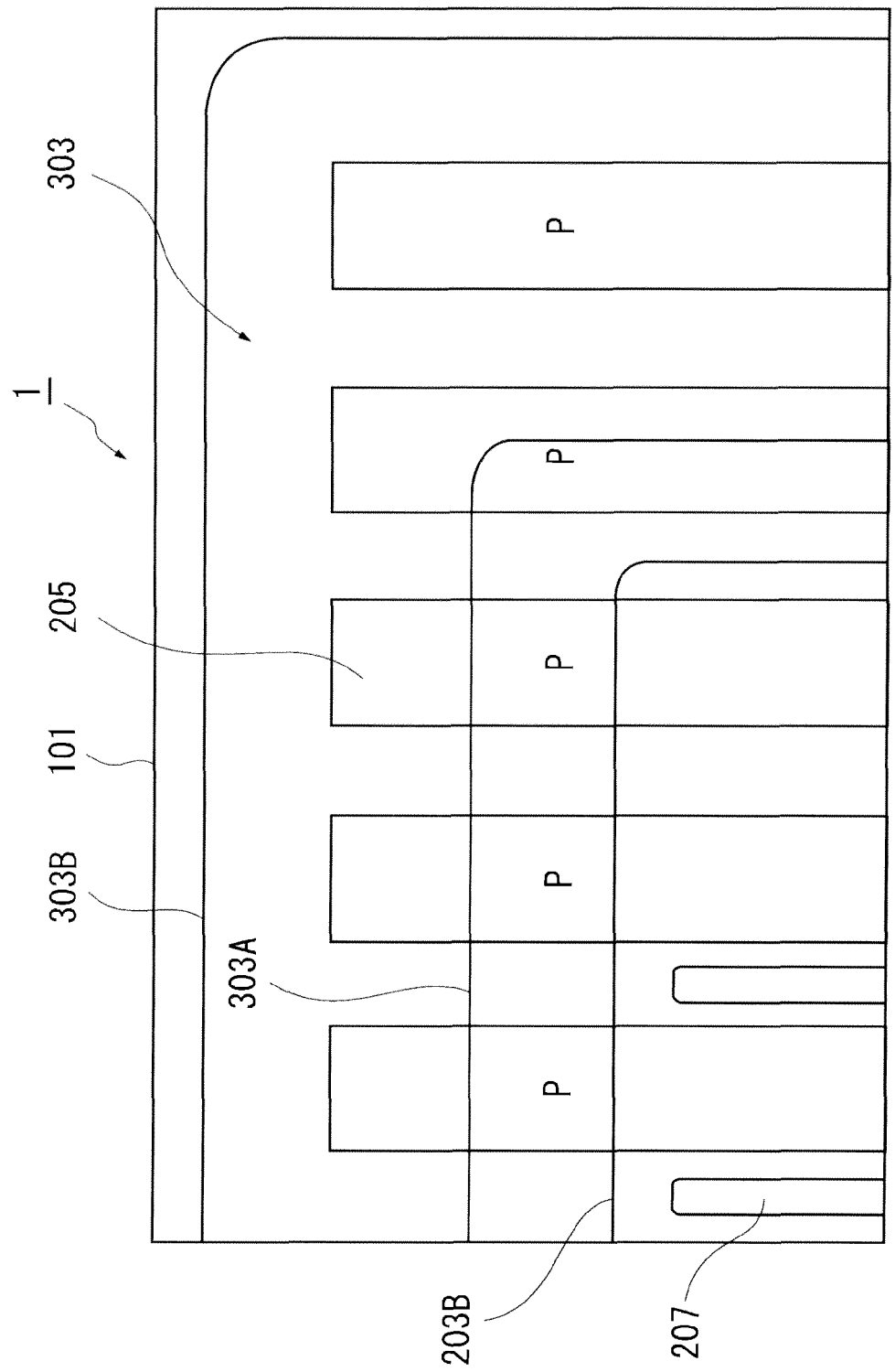
FIG. 2A is a plan view showing the main part of the semiconductor device shown in FIG. 1.
Figure 2B:
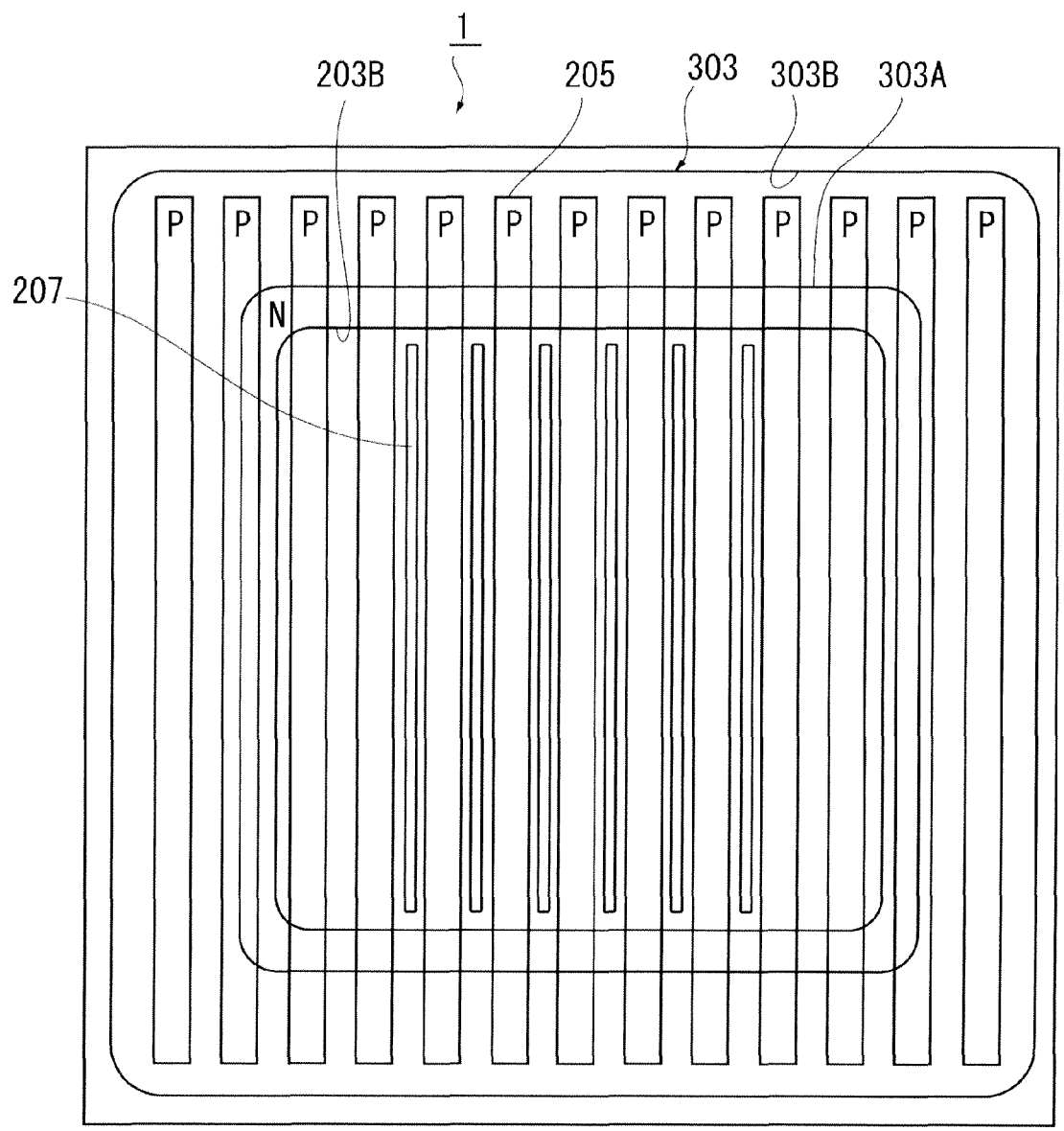
FIG. 2B is an overall plan view of the semiconductor device shown in FIG. 1.

An exemplary structure of a semiconductor device according to a first embodiment of the present invention will be described with reference to the drawings. FIG. 1 is a cross-sectional view showing a main part of the semiconductor device according to the first embodiment. FIG. 2A is a plan view of the main part of the semiconductor device. FIG. 2B is an overall plan view of the semiconductor device. For clarity of illustration, the scale and position of each component are appropriately changed and are different from actual ones.

A semiconductor device 1 of the first embodiment has a structure in which at least one vertical power MOSFET (transistor element) 200 having a super junction (SJ) structure is formed on a first-conductivity-type semiconductor substrate 101. In the first embodiment, a plurality of MOSFETs 200 are formed on a single semiconductor substrate 101. A region in which the plurality of MOSFETs 200 are formed is called an element forming region (cell region) 200X, and a region located outside the element forming region is called an outer peripheral region 300X. There is no clear boundary between the element forming region 200X and the outer peripheral region 300X. Referring to FIG. 1, a region in which a p-type base region 203 is formed is illustrated as the element forming region 200X, and a region located outside the element forming region 200X is illustrated as the outer peripheral region 300X.

In the semiconductor device 1. a semiconductor layer 201 is formed over one surface (upper surface of FIG. 1) of the first-conductivity-type semiconductor substrate 101. A drain electrode 212 is formed over the other surface (lower surface of FIG. 1) of the semiconductor substrate 101.

The MOSFET 200 (the element forming region 200X of the semiconductor device 1) includes:

the semiconductor layer 201 which is formed on one surface (upper surface of FIG. 1) of the semiconductor substrate 101;

an interlayer insulating film 210 which is formed above the semiconductor layer 201;

a source electrode 211 which is electrically connected to the semiconductor layer 201 through contact holes formed in the interlayer insulating film 210;

a gate insulating film 206 and a gate electrode 207 which are formed in trenches formed extending from the upper surface of the semiconductor layer 201; and the drain electrode 212 which is formed on the other surface (lower surface in FIG. 1) of the semiconductor substrate 101.

The MOSFET 200 includes in the semiconductor layer 201:

a first-conductivity-type drift region (drain region having a low impurity concentration) 202;

the second-conductivity-type base region 203 formed on the drift region 202;

a first-conductivity-type source region 204 formed in an upper portion of the base region 203; and second-conductivity-type column regions 205 which are formed in the drift region 202 in a columnar shape under the base region 203.

In the MOSFET 200, the trenches in which the gate insulating film 206 and the gate electrode 207 are formed when viewed in a cross section are each formed extending from the upper surface of the semiconductor layer 201 across at least the source region 204 and the base region 203. As for a plane pattern of the trenches in which the gate insulating film 206 and the gate electrode 207 are formed, see FIGS. 2A and 2B.

In the first embodiment, the first-conductivity-type is n-type, and the second-conductivity-type is p-type. More specifically, the semiconductor substrate 101 is $n^+$-type; the drift region 202 is n-type; the base region 203 is p-type; the source region 204 is $n^+$-type; and the column regions 205 is p-type.

In the semiconductor layer 201, a parallel structure (p/n junction structure) is formed in which the first-conductivity-type drift region 202 and the second-conductivity-type column regions 205 are arranged in parallel in the substrate surface direction.

In the first embodiment, the amount of donor impurity in the first-conductivity-type drift region 202 is preferably set to be substantially equal to the amount of acceptor impurity in the second-conductivity-type column regions 205. The term "substantially equal" means that a deviation within the margin of error is acceptable.

Under the condition that the amount of donor impurity in the first-conductivity-type drift region 202 is substantially equal to the amount of acceptor impurity in the second-conductivity-type column regions 205, the charge in the first-conductivity-type drift region 202 is balanced with the charge in the second-conductivity-type column regions 205 (charge-balanced condition), and the breakdown voltage can be maximized, which is favorable. Under such a charge-balanced condition, when a reverse bias voltage is applied between the drain and source electrodes in the OFF state of the device, depletion layers uniformly extend laterally from the p/n junction between the drift region and the column region. This facilitates the connection between adjacent depletion layers. When the entire SJ structure is depleted and becomes a single depletion layer, equipotential surfaces are disposed at substantially equal intervals and in substantially parallel to each other. Consequently, the breakdown voltage can be maximized. At the stage of designing the SJ structure, the impurity concentration of the drift region can be increased under the charge-balanced condition (in the state where the breakdown voltage is maximized). Therefore, the drift resistance can be reduced and the on-resistance can also be reduced.

Note that the conductivity type and impurity concentration of each of the semiconductor substrate 101. the drift region 202, the base region 203, the source region 204, and the column regions 205 can he appropriately changed without departing from the scope of the present invention. The first and second-conductivity-types may be reversed.

As shown in FIGS. 2A and 2B, in the first embodiment, the plurality of second-conductivity-type column regions 205 which are each formed in a line shape in a plan view are arranged at intervals in the horizontal direction in FIGS. 2A and 2B.

In the first embodiment, in the outer peripheral region 300X, a parallel structure identical with the parallel structure of the first-conductivity-type drift region 202 and the second-conductivity-type column regions 205, which are formed in the element forming region 200X, and a second-conductivity-type annular diffusion region 303 which is spaced apart from the base region and which is formed in an annular shape in a plan view at a side of the second-conductivity-type base region 203 of the element forming region 200X are formed in the semiconductor layer 201. In the first embodiment, the second-conductivity-type annular diffusion region 303 is p-type as with the base region 203 of the element forming region 200X.

The depth and impurity concentration of the second-conductivity-type base region 203 of the element forming region 200X may be the same as or different from those of the second-conductivity-type annular diffusion region 303 of the outer peripheral region 300X, but it is preferable that they be substantially equal to each other.

The second-conductivity-type base region 203 of the element forming region 200X and the second-conductivity-type annular diffusion region 303 of the outer peripheral region 300X are preferably formed in the same process. In this case, even when the second-conductivity-type annular diffusion region 303 is formed, the number of processes does not increase, which is favorable.

In the first embodiment, in the element forming region 200X, the second-conductivity-type base region 203 and the second-conductivity-type column regions 205 are in contact with each other when viewed in a cross section, and in the outer peripheral region 300X, the second-conductivity-type annular diffusion region 303 and the second-conductivity-type column regions 205 are in contact with each other when viewed in a cross section.

As shown in FIG. 1, in the first embodiment, an innermost end 303A and a neighboring portion thereof of the second-conductivity-type annular diffusion region 303 of the outer peripheral region 300X are located on the column region 205, and an outermost end 303B of the second-conductivity-type annular diffusion region 303 is located outside the outermost peripheral column region (the rightmost column region in FIG. 1) 205.

Specifically, the second-conductivity-type annular diffusion region 303 of the outer peripheral region 300X is formed such that the left end shown in FIG. 1 including the innermost end 303A overlaps the column region 205 and the right end shown in FIG. 1 including the outermost end 303B protrudes toward the outside of the outermost peripheral column region 205.

As for a planar relationship among the second-conductivity-type base region 203 of the element forming region 200X, the second-conductivity-type annular diffusion region 303 of the outer peripheral region 300X, and the second-conductivity-type column regions 205, see FIGS. 2A and 2B.

On the semiconductor layer 201 in the outer peripheral region 300X, a field insulating film 306 is stacked so as to cover the second-conductivity-type annular diffusion region 303. Additionally, a field electrode 307 and the interlayer insulating film 210 are sequentially stacked on the field insulating film 306. The field electrode 307 is formed such that a material (e.g., polysilicon) of the gate electrode 207 in the element forming region 200X is extended onto the field insulating film 306 in a region (not shown). The field electrode 307 is connected to a gate pad (not shown).

The first embodiment is provided with the vertical power MOSFET 200 having a so-called super junction structure (SJ structure). This makes it possible to reduce the on-resistance compared to a vertical power MOSFET having no SJ structure, while maintaining a high breakdown voltage characteristic and a large current capacity.

The first embodiment is provided with the vertical power MOSFET 200 having a so-called super junction structure (SJ structure). This makes it possible to reduce the on-resistance beyond the Si limit, while maintaining a high breakdown voltage characteristic and a large current capacity.

In the first embodiment, a repeated structure of a columnar p/n junction (p/n junction between the column regions 205 and the drift region 202), which is one of the features of the SJ structure, is extended to the outer peripheral region 300X, thereby improving the breakdown voltage and breakdown resistance of the outer peripheral region 300X.

Also in the first embodiment, in the outer peripheral region 300X, the second-conductivity-type annular diffusion region 303 is formed such that the innermost end 303A and a neighboring portion thereof are located on the column region 205 and the outermost end 303B is located outside the outermost peripheral column region 205, thereby further improving the breakdown voltage and breakdown resistance of the outer peripheral region 300X.

Figure 3A:
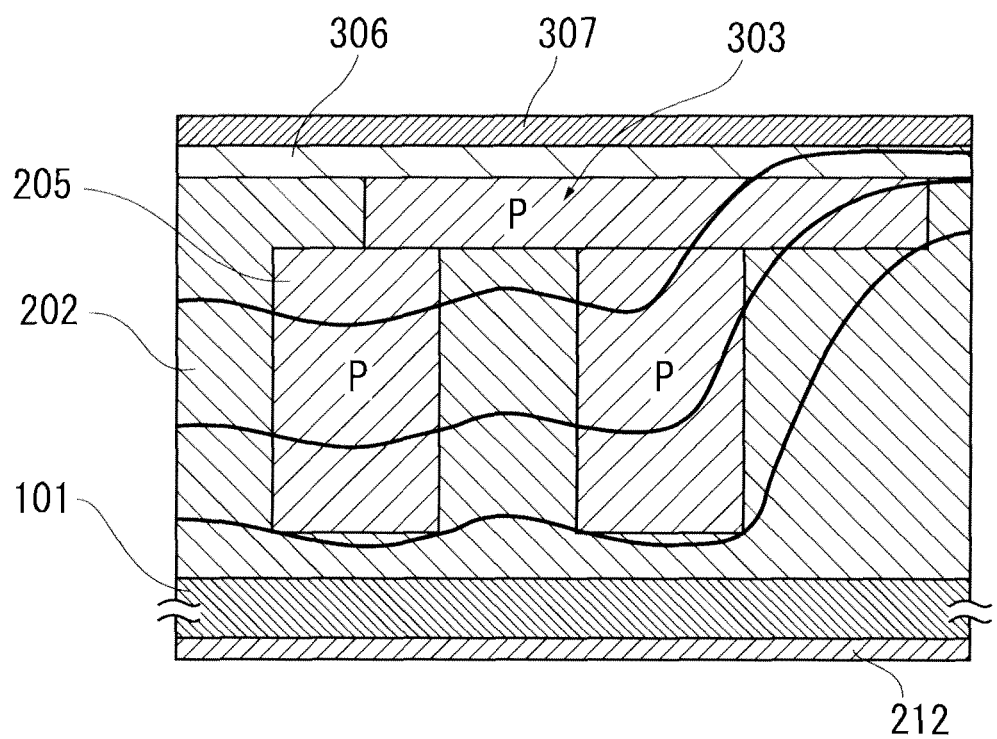
FIG. 3A shows a simulation example of equipotential surfaces in an outer peripheral region according to an example of the present invention.

FIG. 3A shows a simulation example of equipotential surfaces in the outer peripheral region 300X when a sufficiently large reverse bias voltage is applied between the drain and source electrodes in the OFF state of the MOSFET 200 in the first embodiment (Example).

Figure 3B:
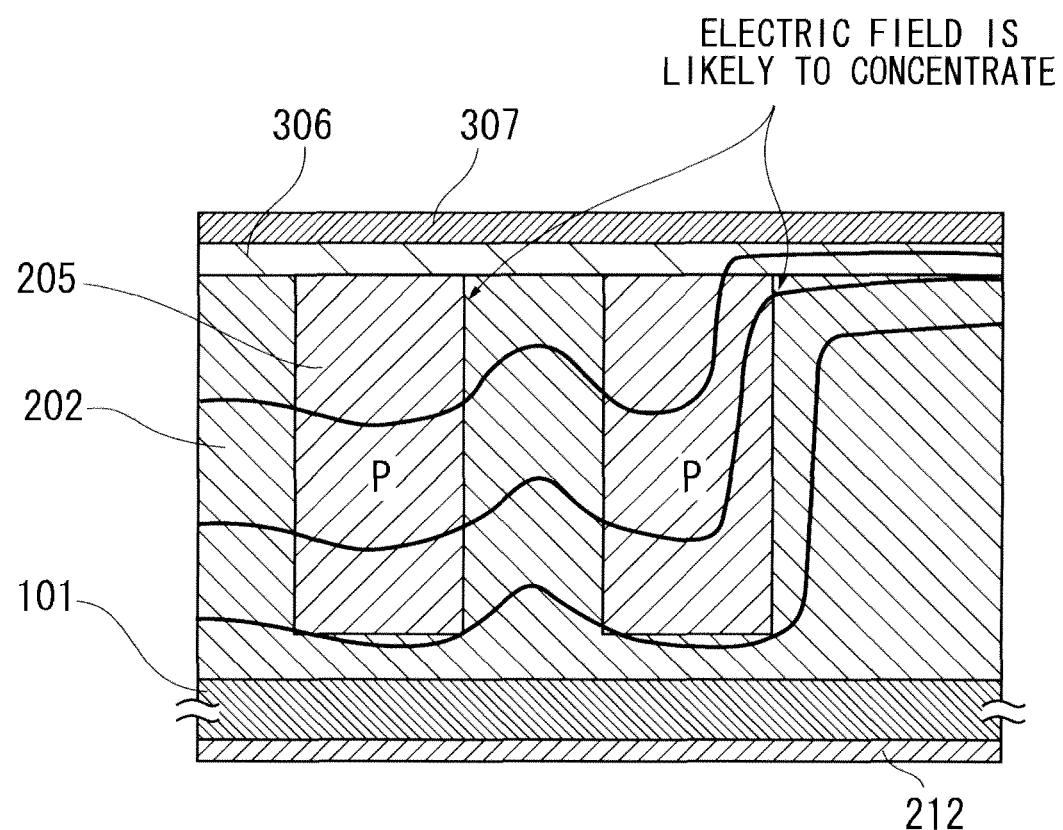
FIG. 3B shows a simulation example of equipotential surfaces in an outer peripheral region according to a comparative example of the present invention.

FIG. 3B shows a simulation example of equipotential surfaces in the outer peripheral region 300X in a structure similar to that of the first embodiment except that the second-conductivity-type annular diffusion region 303 is not formed in the outer peripheral region 300X (Comparative Example). In the structure of Comparative Example, in the outer peripheral region 300X, the second-conductivity-type annular diffusion region 303 is not formed, and the column regions 205 are in direct contact with the field insulating film 306.

As is apparent from comparison between FIGS. 3A and 3B, in FIG. 3B, the curvature of the equipotential surfaces in the vicinity of contact portions between the field insulating film and the outermost peripheral column region diminishes precipitously, and the electric field concentrates on the portions.

Meanwhile, in FIG. 3A, in the outer peripheral region 300X, the second-conductivity-type annular diffusion region 303 is formed such that the innermost end 303A and a neighboring portion thereof are located on the column region 205 and the outermost end 303B is located outside the outermost peripheral column region 205. As a result, the interval between the equipotential surfaces is increased, and the curvature of the equipotential surfaces forms into more gradual curvature. Therefore, the electric field concentration is alleviated.

Since a gate voltage is applied to the field electrode 307, a ground potential is applied in the OFF state of the device. The field electrode 307 has a fixed potential (ground potential) in the OFF state of the device. Accordingly, in a further outside region in which neither the second-conductivity-type column region 205 nor the second-conductivity-type annular diffusion region 303 is formed, the equipotential surfaces become parallel to the field electrode 307 and the drain electrode 212 in both cases of FIGS. 3A and 3B. Thus, the equipotential surfaces which are directed from the outermost peripheral column region 205 toward the field insulating film 306 are curved due to the presence of the field electrode 307 so as to be parallel to the field electrode 307. As a result, the curvature of the equipotential surfaces is more gradual than in the case where the field electrode 307 is not present.

In the first embodiment, the second-conductivity-type base region 203 of the element forming region 200X and the second-conductivity-type annular diffusion region 303 of the outer peripheral region 300X are spaced apart from each other in a plan view. In such a structure, depletion layers extend laterally from the p/n junction between the outer end 203B of the second-conductivity-type base region 203 and the first-conductivity-type drift region 202 of the element forming region 200X and from the p/n junction between the inner end 303A of the second-conductivity-type annular diffusion region 303 and the first-conductivity-type drift region 202. Accordingly, the semiconductor device 1 which is resistant to a lateral electric field is obtained, as compared with the case where the second-conductivity-type base region 203 and the second-conductivity-type annular diffusion region 303 are not spaced apart from each other.

The resistivity (impurity concentration) of the first-conductivity-type drift region 202, the impurity concentration of the second-conductivity-type column region 205, the impurity concentration of the second-conductivity-type annular diffusion region 303, and the length of an overhanging portion of the second-conductivity-type annular diffusion region 303 from the outermost peripheral column region 205 can be appropriately designed depending on a desired breakdown voltage (VDSS).

In the case of obtaining the trench gate type power MOSFET 200 having a breakdown voltage (VDSS) of 55 V in the element forming region 200X, for example, the present inventor considers it desirable to design the power MOSFET 200 as follows. That is, the first-conductivity-type drift region 202 is formed of an epitaxial layer having a resistivity of about 0.50 $\Omega$·cm; the impurity concentration of the second-conductivity-type column region 205 is set to about $6.0 \times 10^{16}$ cm$^{-3}$; the impurity concentration of the second-conductivity-type annular diffusion region 303 is set to about $4.0 \times 10^{16}$ cm$^{-3}$: and the second-conductivity-type annular diffusion region 303 is formed so as to project outwardly by about 5.0 μm from the outermost peripheral column region 205. Note that the values provided herein are merely design examples and may be arbitrarily changed, as a matter of course.

As shown in FIG. 19 of Japanese Unexamined Patent Application Publication No. 2001-298190 (FIG. 18 of US Patent Application Publication No. 2001/0028083) which is cited in the "background" section, the shallow p-type region (20c) is formed so as to surround the element forming region (122), while the column region (20b) formed outside the shallow p-type region (20c) is in contact with the field insulating film (23). Further, the outer peripheral region has no field electrode. Accordingly, equipotential surfaces in an outer peripheral structure disclosed in Japanese Unexamined Patent Application Publication No. 2001-298190 are formed to be substantially vertically to the field insulating film (23) as indicated by the dashed line in FIG. 19 of Japanese Unexamined Patent Application Publication No. 2001-298190 (FIG. 18 of US Patent Application Publication No. 2001/0028083). In short, the electric field concentration is higher and the breakdown voltage and breakdown resistance are lower than those of Comparative Example shown in FIG. 3B.

As illustrated in FIG. 1 of Japanese Unexamined Patent Application Publication No. 2007-103902 (FIGS. 1A and 1B of US Patent Application Publication No. 2007/0052015) cited in the "background" section, the outer peripheral region (56) has no shallow p-type region; the column region (38) is formed at a position shallower than the column regions (34, 36) in the element forming region; and the field electrode (48) is formed in the outer peripheral region (56), as compared with the structure disclosed in Japanese Unexamined Patent Application Publication No. 2001-298190 (US Patent Application Publication No. 2001/0028083). Accordingly, it is considered that the electric field concentration at the contact portion between the outermost peripheral column region (38) and the field insulating film (46) is alleviated in comparison with that of Japanese Unexamined Patent Application Publication No. 2001-298190 (US Patent Application Publication No. 2001/0028083).

However, in the outer peripheral structure disclosed in Japanese Unexamined Patent Application Publication No. 2007-103902 (US Patent Application Publication No. 2007/0052015), the column region (38) is formed at a position deeper than a base region (51) in the element forming region (54). In other words, in the outer peripheral structure disclosed in Japanese Unexamined Patent Application Publication No. 2007-103902 (US Patent Application Publication No. 2007/0052015), the outermost peripheral column region (38) is formed at a position much deeper than the position of the shallow p-type annular diffusion region 303 of the first embodiment. Thus, the equipotential surfaces which are directed from the outermost peripheral column region (38) to the field insulating film (46) are steeper than those shown in FIG. 3A, and the curvature of the equipotential surfaces is smaller than that shown in FIG. 3A. Therefore, in the outer peripheral structure of the first embodiment, the electric field concentration is reduced and the breakdown voltage and breakdown resistance are improved as compared with Japanese Unexamined Patent Application Publication No. 2007-103902 (US Patent Application Publication No. 2007/0052015).

As illustrated in FIG. 1 of Japanese Unexamined Patent Application Publication No. 2006-196518 (US Patent Application Publication No. 2006/0151831) cited in the "background" section, the shallow p-type region (105) and the column region (106a, 106b) are formed in the outer peripheral region, while the innermost end and a neighboring portion thereof of the shallow p-type region (105) in the outer peripheral region are not located on the column region (106a, 106b). Further, the field insulating film (118) and the field electrode (120) are formed in the outer peripheral region, but they are not formed above the shallow p-type region (105) and the column region (106a, 106b).

In Japanese Unexamined Patent Application Publication No. 2006-196518 (US Patent Application Publication No. 2006/0151831), neither a column region nor a base region is formed under the field insulating film. Thus, the effect of making the curvature of equipotential surfaces gentle is smaller than that in Japanese Unexamined Patent Application Publication No. 2007-103902 (US Patent Application Publication No. 2007/0052015).

FIG. 1 of Japanese Unexamined Patent Application Publication No. 2009-088345 (US Patent Application Publication No. 2009/0090968) cited in the "background" section discloses a structure in which the p-type buried semiconductor regions (BGR1 to BGR4) are formed in the outer peripheral region instead of column regions (4); the annular shallow p-type regions (GR1 to GR4) are formed above the buried semiconductor regions (BGR1 to BGR4); and the field electrode (14) is formed immediately above the annular shallow p-type regions (GR1 to GR4).

This semiconductor device has no column regions in the outer peripheral region, but is provided with the plurality of buried semiconductor regions (BGR1 to BGR4) formed at different positions in the thickness direction, instead of the column regions. This complicates the design of the outer peripheral region. Furthermore, the buried semiconductor regions (BGR1 to BGR4) are formed in a process different from that of the column regions in the element forming region. This leads to an increase in the number of processes.

As described above, according to the first embodiment, it is possible to provide the semiconductor device 1 in which the electric field concentration is alleviated and the breakdown voltage and breakdown resistance are improved.

Design Modification Example of First Embodiment

The patterns of the second-conductivity-type column regions 205 are not limited to the line patterns as shown in FIGS. 2A and 2B, but can be modified to any desired pattern.

Figure 4A:
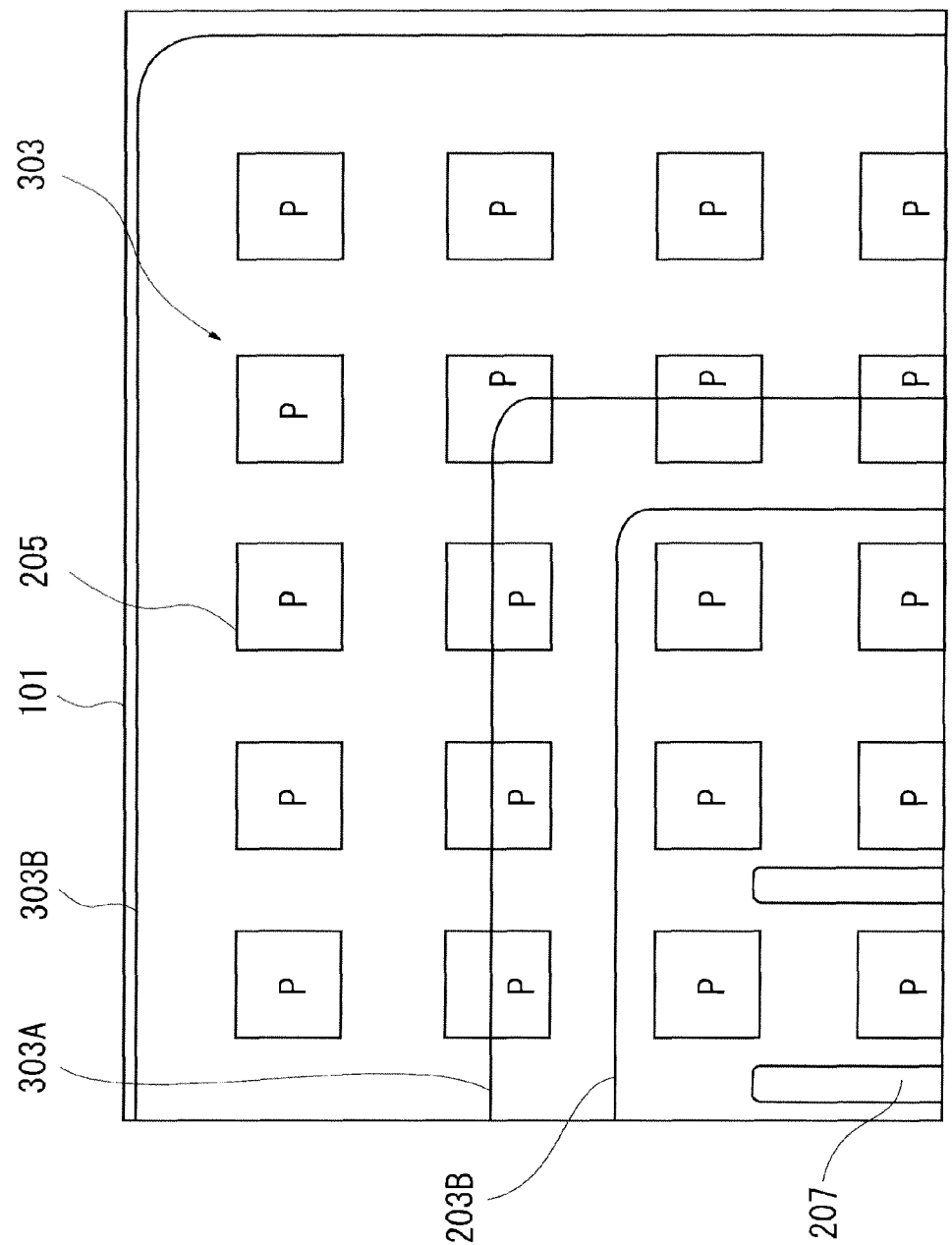
FIG. 4A is a plan view of a main part showing a design modification example.
Figure 4B:
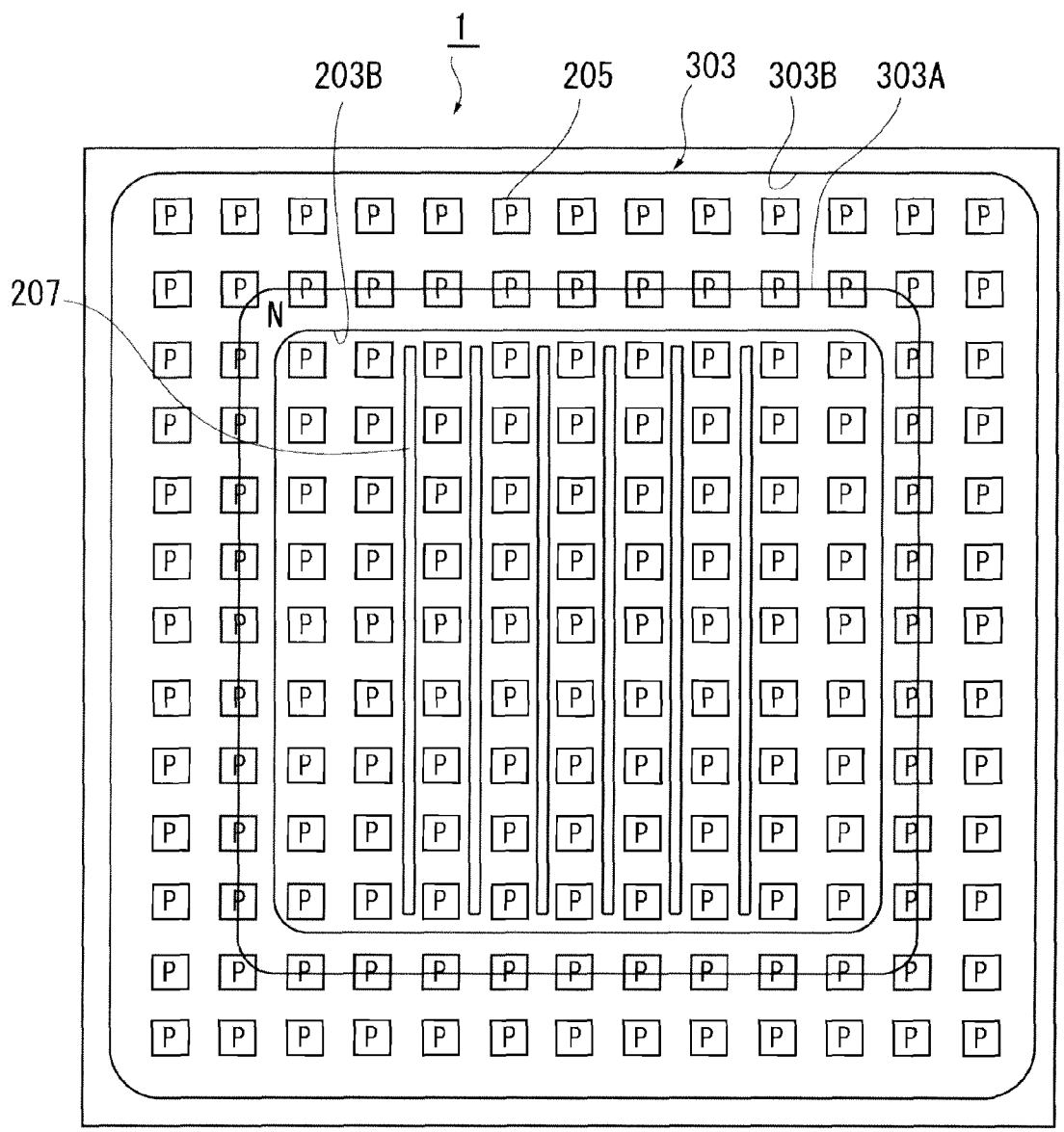
FIG. 4B is an overall plan view showing the design modification example.
Figure 4C:
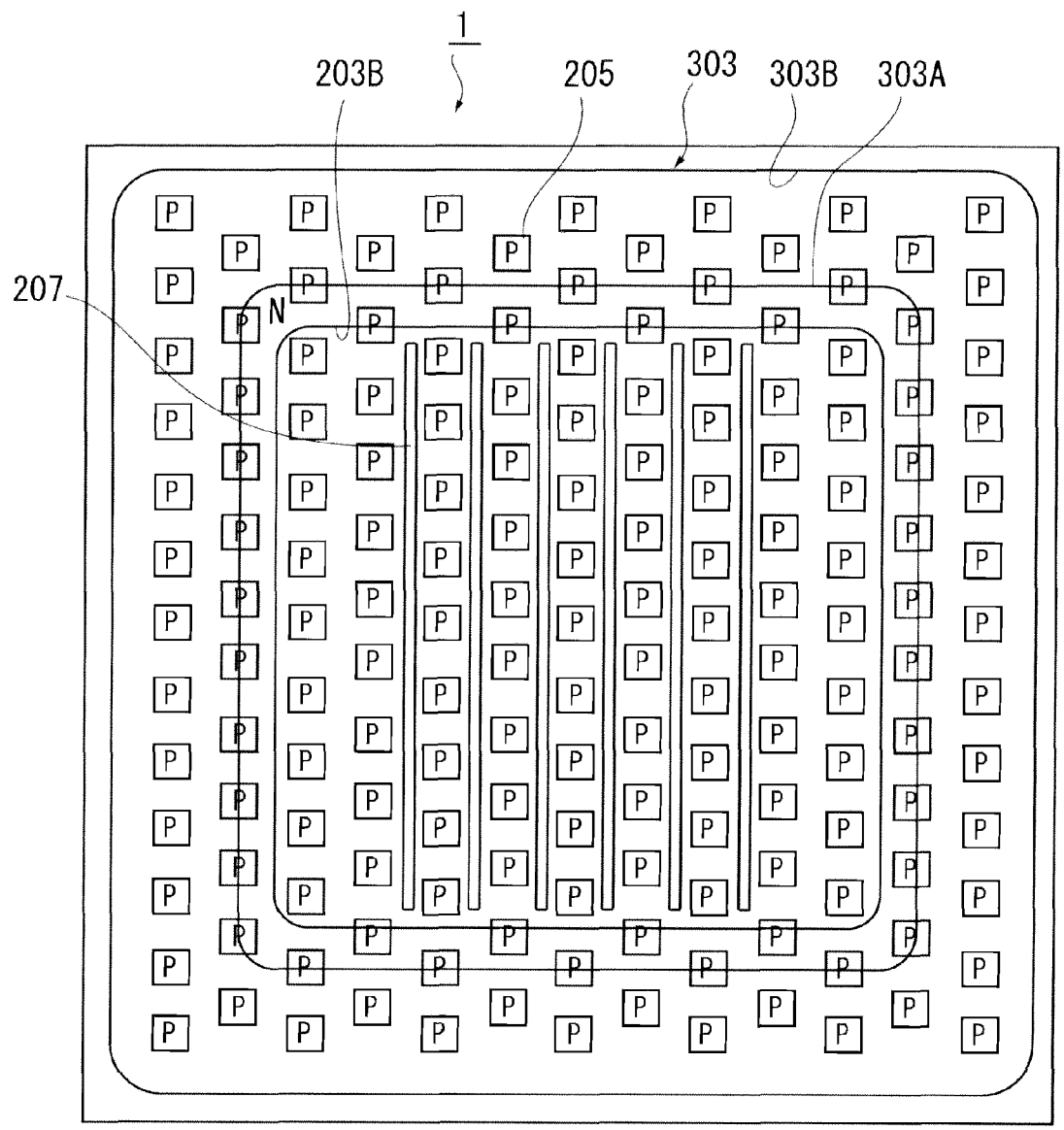
FIG. 4C is an overall plan view showing another design modification example.

The second-conductivity-type column regions 205 may be formed in an array pattern as shown in FIGS. 4A and 4B, or may be formed in a staggered pattern as shown in FIG. 4C.

Also in such cases, the innermost end 303A and a neighboring portion thereof of the second-conductivity-type annular diffusion region 303 in the outer peripheral region 300X are located on the column region 205 of the array pattern or the staggered pattern, and the outermost end 303B thereof is located outside any of outermost peripheral column regions 205, thereby obtaining the same effects as those of the first embodiment.

Second Embodiment

Figure 5:
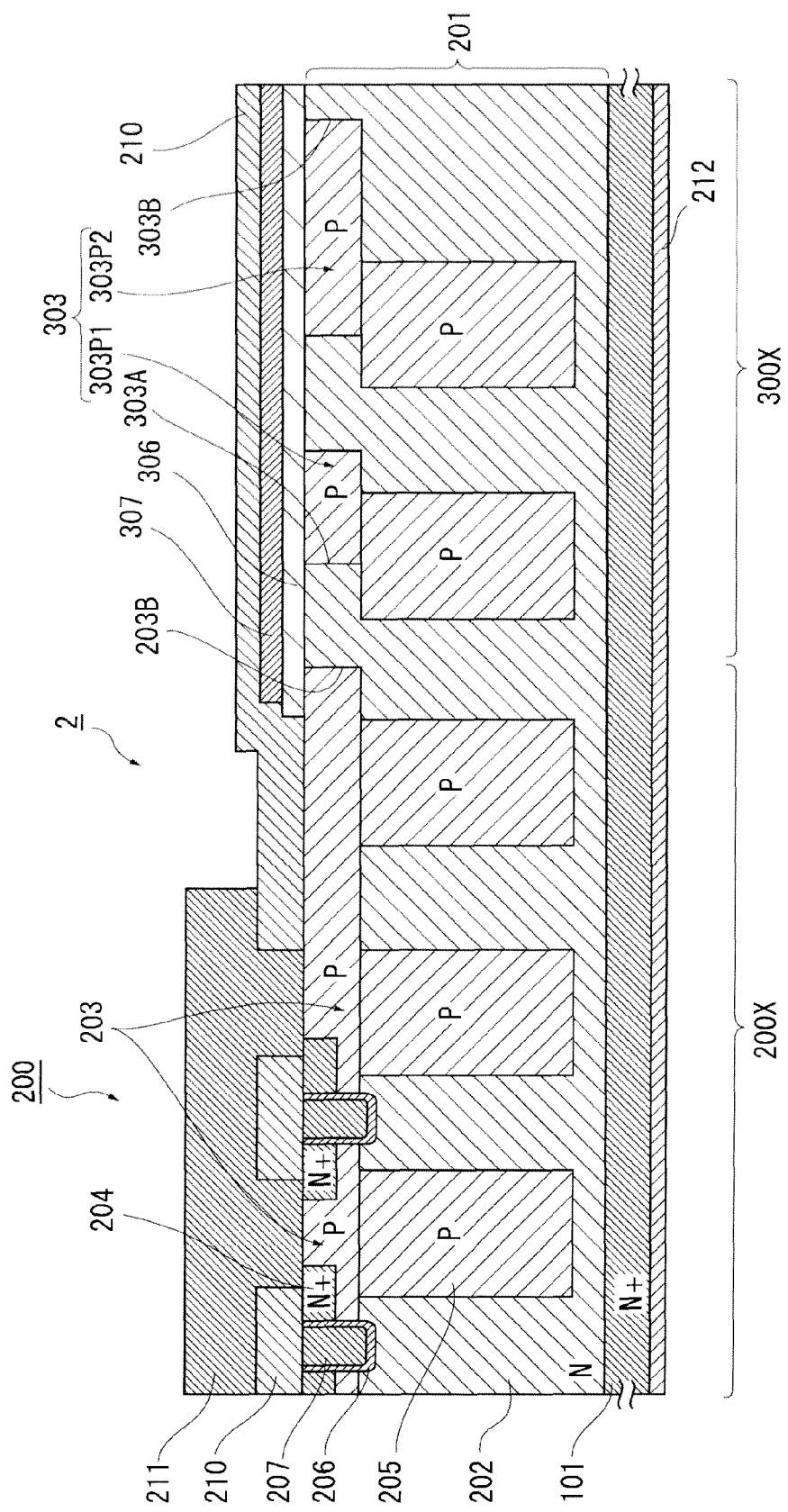
FIG. 5 is a cross-sectional view showing a main part of a semiconductor device according to a second embodiment of the present invention.

A structure of a semiconductor device according to a second embodiment of the present invention will be described with reference to the drawings. FIG. 5 is a cross-sectional view showing a main part of the semiconductor device of the second embodiment. Components identical with those of the first embodiment are denoted by the same reference numerals, and the description thereof is omitted.

A basic structure of a semiconductor device 2 of the second embodiment is similar to that of the first embodiment. In the second embodiment, the second-conductivity-type annular diffusion region 303 in the outer peripheral region 300X is divided into a plurality of regions with a gap therebetween. In the second embodiment, the second-conductivity-type annular diffusion region 303 is divided into two regions 303P1 (inside) and 304P2 (outside).

In the second embodiment, the positions of the innermost end 303A and the outermost end 303B of the second-conductivity-type annular diffusion region 303 are the same as those of the first embodiment. Specifically, the innermost end 303A (corresponding to the inner end of the innermost divided region 303P1) and a neighboring portion thereof of the second-conductivity-type annular diffusion region 303 are located on the second-conductivity-type column region 205, and the outermost end 303B (corresponding to the outer end of the outermost divided region 303P2) is located outside the outermost peripheral second-conductivity-type column region 205.

Also in the second embodiment, the same effects as those of the first embodiment can be obtained.

Furthermore, according to the semiconductor device 2 of the second embodiment, the second-conductivity-type annular diffusion region 303 is divided into the plurality of divided regions 303P1 and 303P2. Accordingly, the lateral electric field is shared by the p/n junctions at the edges of the divided regions, thereby obtaining the semiconductor device 2 having a higher resistance to the lateral electric field. The number of divided regions of the second-conductivity-type annular diffusion region 303 and the gap between the plurality of divided regions can be arbitrarily designed.

Third Embodiment

Figure 6:
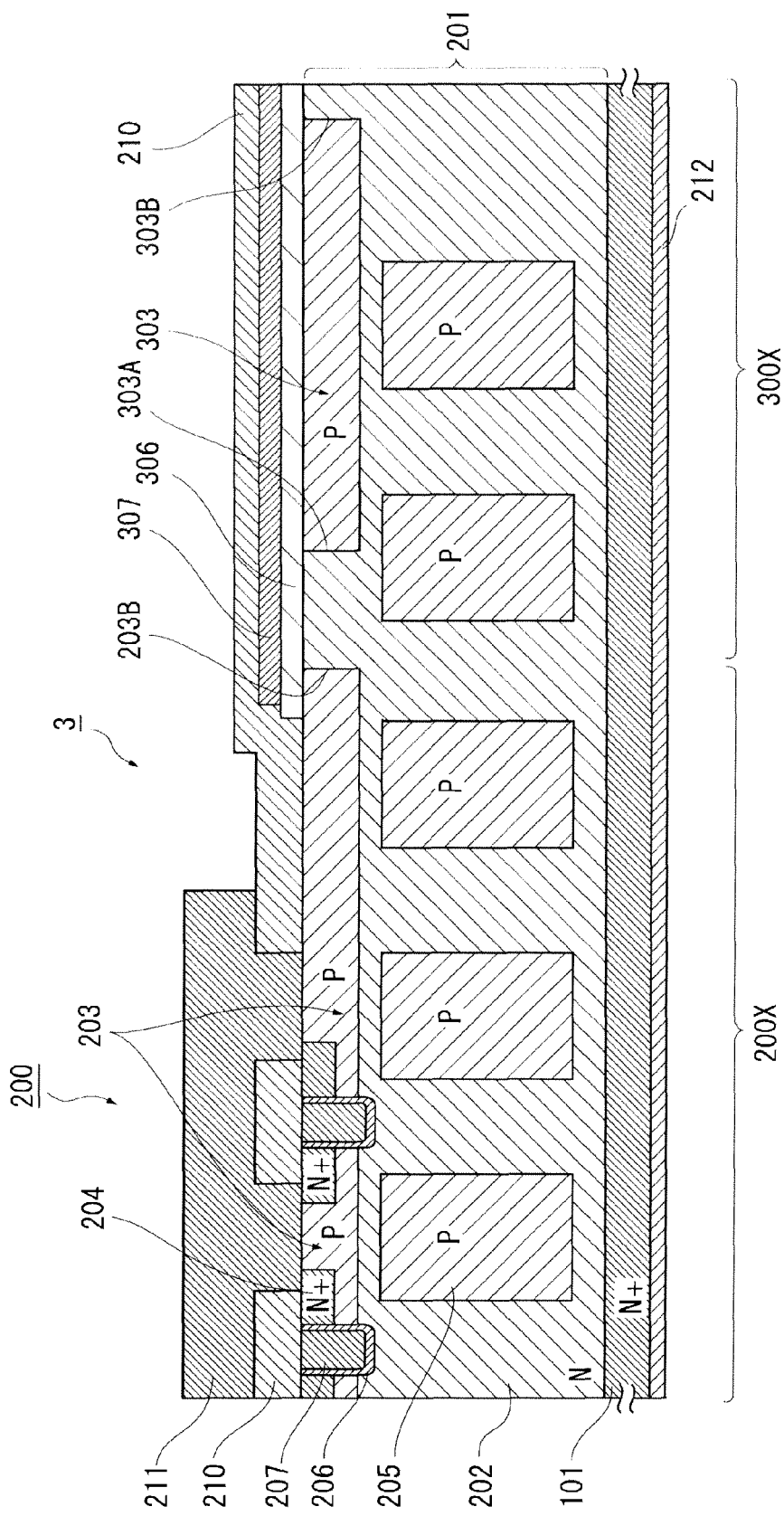
FIG. 6 is a cross-sectional view showing a main part of a semiconductor device according to a third embodiment of the present invention.
Figure 7:
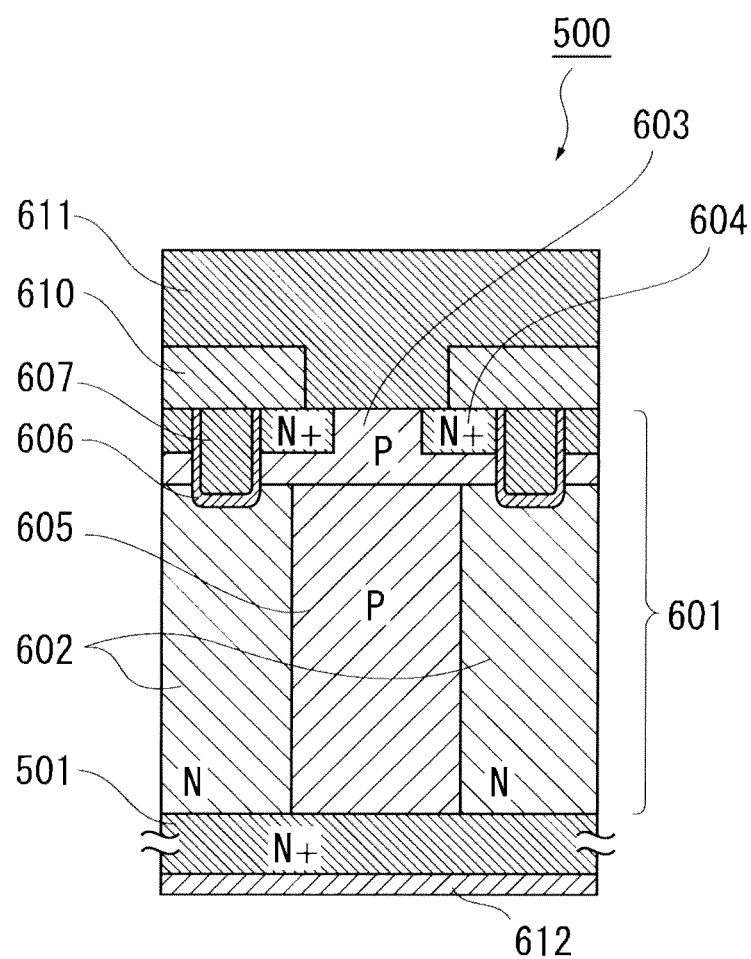
FIG. 7 is a cross-sectional view of a main part showing a basic structure of a vertical power MOSFET having a SJ structure.

A structure of a semiconductor device according to a third embodiment of the present invention will be described with reference to the drawings. FIG. 6 is a cross-sectional view showing a main part of the semiconductor device according to the third embodiment. Components identical with those of the first embodiment are denoted by the same reference numerals, and the description thereof is omitted.

A basic structure of a semiconductor device 3 of the third embodiment is similar to that of the first embodiment. According to the third embodiment, in the element forming region 200X, the second-conductivity-type base region 203 and the second-conductivity-type column regions 205 are spaced apart from each other when viewed in a cross section. The second-conductivity-type base region 203 of the element forming region 200X and the second-conductivity-type annular diffusion region 303 of the outer peripheral region 300X are preferably formed in the same process. As in the relationship between the second-conductivity-type base region 203 and the second-conductivity-type column region 205 in the element forming region 200X, the second-conductivity-type annular diffusion region 303 and the second-conductivity-type column regions 205 are spaced apart from each other when viewed in a cross section in the outer peripheral region 300X.

Also in the third embodiment, the same advantageous effects as those of the first embodiment can be obtained.

Furthermore, in the third embodiment, the second-conductivity-type base region 203 and the second-conductivity-type column regions 205 are spaced apart from each other when viewed in a cross section in the element forming region 200X. Accordingly, in the element forming region 200X, an on-state current path formed on the trench gate side surface is widened, thereby reducing the on-resistance compared to the first embodiment.

Moreover, since the second-conductivity-type base region 203 and the second-conductivity-type column regions 205 are spaced apart and independent from each other in the element forming region 200X when viewed in a cross section, the design of these regions can be easily optimized. Similarly, since the second-conductivity-type annular diffusion region 303 and the second-conductivity-type column regions 205 are spaced apart and independent from each other in the outer peripheral region 300X when viewed in a cross section, the design of these regions can be easily optimized.

Also in the third embodiment, the second-conductivity-type annular diffusion region 303 of the outer peripheral region 300X may he divided into a plurality of divided regions like in the semiconductor device 2 shown in FIG. 5.

Design Modification

The present invention is not limited to the above embodiments, but can be modified in various manners without departing from the scope of the present invention.

The above embodiments have exemplified semiconductor devices including a MOSFET having the SJ structure. The present invention can also he applied to semiconductor devices including an IGBT (Insulated Gate Bipolar Transistor) having the SJ structure, for example.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a semiconductor substrate including a semiconductor layer formed on one surface thereof; and
in an element forming region of the semiconductor layer, at least one transistor element including, a first parallel structure in which a first-conductivity-type drift region and a second-conductivity-type column region are formed in parallel to each other in a substrate surface direction, and a second-conductivity-type base region formed above the first parallel structure, the at least one transistor element being formed on the semiconductor substrate, wherein
in an outer peripheral region located outside the element forming region in which the at least one transistor element is formed, a second parallel structure of a first-conductivity-type drift region and a second-conductivity-type column region, and a second-conductivity-type annular diffusion region which is spaced apart from the base region at a side of the base region of the transistor element and which is formed in an annular shape in a plan view are formed in the semiconductor layer,
an innermost end and a neighboring portion of the second-conductivity-type annular diffusion region in the outer peripheral region are located on a portion of an upper surface of the column region of the outer peripheral region, and an outermost end of the second-conductivity-type annular diffusion region in the outer peripheral region is located outside an outermost peripheral column region of the outer peripheral region, and
a field insulating film that covers the second-conductivity-type annular diffusion region is stacked on the semiconductor layer in the outer peripheral region and covers the base region in the element forming region.

2. The semiconductor device according to claim 1, wherein a field electrode electrically connected to a gate electrode of the transistor element is stacked on the field insulating film.

3. The semiconductor device according to claim 1, wherein the base region and the column region of the element forming region are in contact with each other in the element forming region when viewed in a cross section, and the second-conductivity-type annular diffusion region and the column region of the outer peripheral region are in contact with each other in the outer peripheral region when viewed in a cross section.

4. The semiconductor device according to claim 1, wherein the base region and the column region of the element forming region are spaced apart from each other in the element forming region when viewed in a cross section, and the second-conductivity-type annular diffusion region and the column region of the outer peripheral region are spaced apart from each other in the outer peripheral region when viewed in a cross section.

5. The semiconductor device according to claim 1, wherein the second-conductivity-type annular diffusion region in the outer peripheral region is divided into a plurality of regions when viewed in a plan view.

* * * * *